(12) United States Patent
Roy

(10) Patent No.: US 9,788,455 B1
(45) Date of Patent: Oct. 10, 2017

(54) ELECTRONIC EQUIPMENT DATA CENTER OR CO-LOCATION FACILITY DESIGNS AND METHODS OF MAKING AND USING THE SAME

(75) Inventor: Rob Roy, Las Vegas, NV (US)

(73) Assignee: Switch, Ltd., Las Vegas, NV (US)

( * ) Notice: Subject to any disclaimer, the term of this patent is extended or adjusted under 35 U.S.C. 154(b) by 813 days.

(21) Appl. No.: 12/138,771

(22) Filed: Jun. 13, 2008

Related U.S. Application Data

(60) Provisional application No. 60/944,082, filed on Jun. 14, 2007.

(51) Int. Cl.
   *H05K 7/20* (2006.01)

(52) U.S. Cl.
   CPC .................... *H05K 7/20* (2013.01)

(58) Field of Classification Search
   CPC .................. H05K 7/20; G06F 1/20
   USPC ................................. 454/184, 187
   See application file for complete search history.

(56) References Cited

U.S. PATENT DOCUMENTS

| | | | |
|---|---|---|---|
| 2,330,769 A * | 9/1943 | Wichner | F16L 9/003 285/319 |
| 3,192,306 A | 6/1965 | Skonnord | |
| 3,202,580 A | 8/1965 | Bell | |
| 3,513,326 A | 5/1970 | Potts | |
| 3,840,124 A | 10/1974 | Atwater | |
| 3,985,957 A | 10/1976 | Torn | |
| 4,028,293 A | 6/1977 | Van Den Berg | |
| 4,102,463 A * | 7/1978 | Schmidt | 414/631 |
| 4,118,608 A | 10/1978 | Kussy | |
| 4,171,029 A | 10/1979 | Beale | |
| 4,189,990 A | 2/1980 | Kittler | |
| 4,233,858 A | 11/1980 | Rowlett | |
| 4,258,271 A | 3/1981 | Chappell | |
| 4,320,261 A | 3/1982 | Scerbo et al. | |
| 4,434,390 A | 2/1984 | Elms | |
| 4,453,117 A | 6/1984 | Elms | |
| 4,456,867 A | 6/1984 | Mallick et al. | |
| 4,461,986 A | 7/1984 | Maynard et al. | |
| 4,467,260 A | 8/1984 | Mallick | |
| 4,476,423 A | 10/1984 | Mallick | |
| 4,548,164 A | 10/1985 | Ylonen et al. | |
| 4,663,911 A | 5/1987 | Gracia | |
| 4,996,909 A | 3/1991 | Vache et al. | |
| 5,003,867 A | 4/1991 | Sodec et al. | |
| 5,271,585 A | 12/1993 | Zetena | |
| 5,312,296 A | 5/1994 | Aalto et al. | |
| 5,322,646 A | 6/1994 | Wright et al. | |
| 5,438,781 A | 8/1995 | Landmann | |
| 5,473,114 A | 12/1995 | Vogel | |
| 5,570,740 A | 11/1996 | Flores et al. | |
| 5,657,641 A | 8/1997 | Cunningham et al. | |
| 5,769,365 A | 6/1998 | Onishi | |

(Continued)

*Primary Examiner* — Steven B McAllister
*Assistant Examiner* — Samantha Miller
(74) *Attorney, Agent, or Firm* — Weide & Miller, Ltd.

(57) ABSTRACT

The present invention relates to electronic equipment data center or co-location facility designs and methods of making and using the same in an environmentally aware manner, and generally provides apparatus and methods for using novel support bracket structures, and thermal panels associated with the same, that allow for distinct partitioning of air flowing in hot aisles and cold aisles, as well as for holding wiring above cabinets that are used to store electronic equipment in the facility.

25 Claims, 8 Drawing Sheets

(56) References Cited

U.S. PATENT DOCUMENTS

| | | | |
|---|---|---|---|
| 5,784,847 A | 7/1998 | Wiklund | |
| 5,852,904 A * | 12/1998 | Yu | E04B 2/7422 160/135 |
| 5,880,544 A | 3/1999 | Ikeda | |
| 5,885,154 A | 3/1999 | Napadow et al. | |
| 5,941,767 A | 8/1999 | Fukuda et al. | |
| 5,969,292 A * | 10/1999 | Snider et al. | 174/498 |
| 6,034,873 A * | 3/2000 | Ståhl et al. | 361/701 |
| 6,129,316 A | 10/2000 | Bauer | |
| 6,224,016 B1 | 5/2001 | Lee et al. | |
| 6,231,704 B1 | 5/2001 | Carpinetti | |
| 6,365,830 B1 * | 4/2002 | Snider, Jr. | H02G 3/0456 174/484 |
| 6,374,627 B1 * | 4/2002 | Schumacher | H05K 7/2079 165/104.33 |
| 6,394,398 B1 | 5/2002 | Reed | |
| 6,407,533 B1 | 6/2002 | Bartek et al. | |
| 6,412,260 B1 | 7/2002 | Lukac | |
| 6,412,292 B2 | 7/2002 | Spinazzola et al. | |
| 6,427,454 B1 | 8/2002 | West | |
| 6,437,243 B1 | 8/2002 | VanderVelde | |
| 6,453,055 B1 | 9/2002 | Fukumura et al. | |
| 6,481,527 B1 | 11/2002 | French et al. | |
| 6,506,110 B1 | 1/2003 | Borisch | |
| 6,535,382 B2 | 3/2003 | Bishop et al. | |
| 6,541,704 B1 | 4/2003 | Levenson et al. | |
| 6,566,775 B1 | 5/2003 | Fradella | |
| 6,567,769 B2 | 5/2003 | Chang | |
| 6,574,970 B2 | 6/2003 | Spinazzola et al. | |
| 6,592,448 B1 | 7/2003 | Williams | |
| 6,616,524 B2 | 9/2003 | Storck et al. | |
| 6,707,688 B2 | 3/2004 | Reyes et al. | |
| 6,722,151 B2 | 4/2004 | Spinazzola et al. | |
| 6,742,942 B2 | 6/2004 | Hering et al. | |
| 6,745,579 B2 | 6/2004 | Spinazzola et al. | |
| 6,794,777 B1 | 9/2004 | Fradella | |
| 6,817,688 B2 | 11/2004 | O'Halloran | |
| 6,822,859 B2 | 11/2004 | Coglitore et al. | |
| 6,846,132 B2 | 1/2005 | Kennedy et al. | |
| 6,848,267 B2 | 2/2005 | Pierson | |
| 6,859,366 B2 | 2/2005 | Fink | |
| 6,862,179 B2 * | 3/2005 | Beitelmal et al. | 361/679.53 |
| 6,867,967 B2 * | 3/2005 | Mok | G06F 1/16 236/49.3 |
| 6,897,587 B1 | 5/2005 | McMullen | |
| 6,957,670 B1 | 10/2005 | Kajino | |
| 6,967,283 B2 | 11/2005 | Rasmussen et al. | |
| 6,981,915 B2 | 1/2006 | Moore et al. | |
| 7,003,374 B2 | 2/2006 | Olin et al. | |
| 7,033,267 B2 | 4/2006 | Rasmussen et al. | |
| 7,042,722 B2 | 5/2006 | Suzuki et al. | |
| 7,061,715 B2 * | 6/2006 | Miyamoto | G06F 1/20 360/99.25 |
| 7,100,827 B2 | 9/2006 | Olin et al. | |
| 7,232,236 B2 | 6/2007 | Vitense et al. | |
| 7,315,448 B1 | 1/2008 | Bash et al. | |
| 7,369,741 B2 | 5/2008 | Reagan et al. | |
| 7,372,695 B2 * | 5/2008 | Coglitore | G06F 1/20 361/679.48 |
| 7,430,118 B1 | 9/2008 | Noteboom et al. | |
| 7,448,945 B2 | 11/2008 | Bessent | |
| 7,477,514 B2 | 1/2009 | Campbell et al. | |
| 7,486,511 B1 | 2/2009 | Griffel et al. | |
| 7,500,911 B2 | 3/2009 | Johnson et al. | |
| 7,505,849 B2 | 3/2009 | Saarikivi | |
| 7,508,663 B2 | 3/2009 | Coglitore et al. | |
| 7,542,287 B2 | 6/2009 | Lewis et al. | |
| 7,604,535 B2 | 10/2009 | Germagian et al. | |
| 7,641,546 B2 | 1/2010 | Bok et al. | |
| 7,656,660 B2 | 2/2010 | Hoeft | |
| 7,667,965 B2 | 2/2010 | Nobile | |
| 7,675,747 B1 | 3/2010 | Ong et al. | |
| 7,684,193 B2 | 3/2010 | Fink et al. | |
| 7,688,578 B2 | 3/2010 | Mann et al. | |
| 7,778,030 B1 | 8/2010 | Chiriac | |
| 7,787,260 B2 | 8/2010 | Hruby et al. | |
| 7,789,359 B2 | 9/2010 | Chopp et al. | |
| 7,804,685 B2 | 9/2010 | Krietzman | |
| 7,804,690 B2 | 9/2010 | Huang et al. | |
| 7,862,410 B2 | 1/2011 | McMahan et al. | |
| 7,894,190 B2 | 2/2011 | Davis et al. | |
| 7,903,407 B2 | 3/2011 | Matsushima et al. | |
| 7,954,070 B2 | 5/2011 | Plocher et al. | |
| 7,957,139 B2 | 6/2011 | Davis et al. | |
| 7,971,446 B2 * | 7/2011 | Clidaras | G06F 1/20 62/259.2 |
| 8,037,644 B2 | 10/2011 | Hall | |
| 8,040,673 B2 | 10/2011 | Krietzman | |
| 8,072,780 B1 | 12/2011 | Roy | |
| 8,113,010 B2 | 2/2012 | Carlson | |
| 8,144,467 B2 | 3/2012 | Campbell et al. | |
| 8,180,495 B1 | 5/2012 | Roy | |
| 8,209,993 B2 | 7/2012 | Carlson et al. | |
| 8,223,495 B1 | 7/2012 | Carlson et al. | |
| 8,257,155 B2 | 9/2012 | Lewis | |
| 8,282,451 B2 | 10/2012 | Taylor | |
| 8,300,410 B2 | 10/2012 | Slessman | |
| 8,806,238 B2 | 8/2014 | Jau | |
| 2001/0029163 A1 | 10/2001 | Spinazzola et al. | |
| 2002/0005457 A1 | 1/2002 | Lee et al. | |
| 2002/0059804 A1 | 5/2002 | Spinazzola et al. | |
| 2002/0108386 A1 | 8/2002 | Spinazzola et al. | |
| 2002/0121555 A1 | 9/2002 | Cipolla et al. | |
| 2003/0050003 A1 | 3/2003 | Charron | |
| 2003/0122379 A1 | 7/2003 | Woods | |
| 2003/0124971 A1 | 7/2003 | Williams | |
| 2003/0143942 A1 | 7/2003 | Kennedy et al. | |
| 2003/0181158 A1 | 9/2003 | Schell et al. | |
| 2003/0183955 A1 | 10/2003 | Fields | |
| 2003/0231881 A1 | 12/2003 | Hering et al. | |
| 2004/0004813 A1 | 1/2004 | Cogltore et al. | |
| 2004/0099747 A1 | 5/2004 | Johnson et al. | |
| 2004/0118137 A1 | 6/2004 | Patel et al. | |
| 2004/0148934 A1 | 8/2004 | Pinkerton | |
| 2004/0218355 A1 | 11/2004 | Bash et al. | |
| 2005/0034468 A1 | 2/2005 | Dietz | |
| 2005/0099770 A1 * | 5/2005 | Fink | E04H 5/02 361/690 |
| 2005/0167135 A1 | 8/2005 | Jackson | |
| 2005/0170770 A1 | 8/2005 | Johnson et al. | |
| 2005/0185363 A1 | 8/2005 | Rasmussen et al. | |
| 2005/0225936 A1 | 10/2005 | Day | |
| 2005/0246057 A1 | 11/2005 | Olin et al. | |
| 2005/0246132 A1 | 11/2005 | Olin et al. | |
| 2005/0278070 A1 | 12/2005 | Bash et al. | |
| 2006/0021786 A1 | 2/2006 | Fetterolf et al. | |
| 2006/0026954 A1 | 2/2006 | Truong | |
| 2006/0055175 A1 | 3/2006 | Grinblat | |
| 2006/0056127 A1 | 3/2006 | Lewis | |
| 2006/0066163 A1 | 3/2006 | Melfi | |
| 2006/0072277 A1 | 4/2006 | Schmidt et al. | |
| 2006/0082263 A1 | 4/2006 | Rimler et al. | |
| 2006/0146520 A1 * | 7/2006 | Vitense et al. | 362/153 |
| 2006/0158037 A1 | 7/2006 | Danley | |
| 2006/0185931 A1 | 8/2006 | Kawar | |
| 2006/0187636 A1 | 8/2006 | Fink et al. | |
| 2006/0236487 A1 | 10/2006 | Dean | |
| 2006/0260338 A1 | 11/2006 | VanGilder et al. | |
| 2006/0276121 A1 | 12/2006 | Rasmussen et al. | |
| 2006/0277501 A1 | 12/2006 | Plocher et al. | |
| 2006/0281061 A1 | 12/2006 | Hightower | |
| 2007/0021050 A1 | 1/2007 | Kennedy | |
| 2007/0032979 A1 | 2/2007 | Hamann et al. | |
| 2007/0040263 A1 | 2/2007 | Towada | |
| 2007/0064389 A1 | 3/2007 | Lewis, II et al. | |
| 2007/0078635 A1 | 4/2007 | Rasmussen et al. | |
| 2007/0082195 A1 | 4/2007 | Goecke et al. | |
| 2007/0129000 A1 | 6/2007 | Rasmussen et al. | |
| 2007/0135032 A1 | 6/2007 | Wang | |
| 2007/0171613 A1 | 7/2007 | McMahan et al. | |
| 2007/0211443 A1 | 9/2007 | Wechter et al. | |
| 2007/0243425 A1 | 10/2007 | Spaner | |
| 2007/0253181 A1 | 11/2007 | Bersiek | |

(56) References Cited

U.S. PATENT DOCUMENTS

| | | |
|---|---|---|
| 2007/0267247 A1 | 11/2007 | Tartsch |
| 2008/0029250 A1 | 2/2008 | Carlson et al. |
| 2008/0035810 A1 | 2/2008 | Lewis |
| 2008/0055848 A1 | 3/2008 | Hamburgen et al. |
| 2008/0055850 A1 | 3/2008 | Carlson et al. |
| 2008/0137266 A1 | 6/2008 | Jensen |
| 2008/0264688 A1 | 10/2008 | Chopp et al. |
| 2008/0299890 A1 | 12/2008 | Orrell |
| 2008/0305733 A1* | 12/2008 | Noteboom et al. ........... 454/184 |
| 2009/0051545 A1 | 2/2009 | Koblasz |
| 2009/0061756 A1 | 3/2009 | Germagian |
| 2009/0064551 A1 | 3/2009 | Schroder et al. |
| 2009/0195977 A1 | 8/2009 | Fink et al. |
| 2009/0197684 A1 | 8/2009 | Arezina et al. |
| 2009/0228726 A1 | 9/2009 | Malik |
| 2009/0229510 A1 | 9/2009 | Sutter |
| 2009/0235097 A1 | 9/2009 | Hamilton |
| 2009/0239460 A1 | 9/2009 | Lucia et al. |
| 2009/0239461 A1* | 9/2009 | Lewis et al. ................. 454/184 |
| 2009/0277605 A1 | 11/2009 | Vangilder et al. |
| 2009/0308579 A1 | 12/2009 | Johnson et al. |
| 2009/0319650 A1 | 12/2009 | Collins |
| 2010/0003911 A1 | 1/2010 | Graczyk et al. |
| 2010/0016730 A1 | 1/2010 | Tanaka et al. |
| 2010/0048119 A1 | 2/2010 | Tashiro |
| 2010/0061059 A1* | 3/2010 | Krietzman et al. ........... 361/690 |
| 2010/0144265 A1 | 6/2010 | Bednarcik et al. |
| 2010/0151781 A1 | 6/2010 | Slessman et al. |
| 2010/0187832 A1 | 7/2010 | Holland |
| 2010/0190430 A1 | 7/2010 | Rodrigues et al. |
| 2010/0201230 A1 | 8/2010 | Schweitzer et al. |
| 2010/0216388 A1 | 8/2010 | Tresh et al. |
| 2010/0223800 A1 | 9/2010 | Morrison et al. |
| 2010/0245083 A1 | 9/2010 | Lewis |
| 2010/0248609 A1 | 9/2010 | Tresh et al. |
| 2010/0248610 A1 | 9/2010 | Caveney et al. |
| 2010/0267325 A1 | 10/2010 | Matser et al. |
| 2010/0304657 A1 | 12/2010 | Gallmann et al. |
| 2010/0328889 A1 | 12/2010 | Campbell |
| 2011/0009047 A1 | 1/2011 | Noteboom et al. |
| 2011/0014862 A1 | 1/2011 | Honold et al. |
| 2011/0031071 A1 | 2/2011 | Takeuchi |
| 2011/0078480 A1 | 3/2011 | Calo et al. |
| 2011/0105010 A1 | 5/2011 | Day |
| 2011/0122570 A1 | 5/2011 | Beck et al. |
| 2011/0143644 A1* | 6/2011 | McMahan et al. ........... 454/184 |
| 2011/0156480 A1 | 6/2011 | Park |
| 2012/0041569 A1 | 2/2012 | Zhang |
| 2012/0331317 A1 | 12/2012 | Rogers |

* cited by examiner

ELECTRONIC EQUIPMENT DATA CENTER OR CO-LOCATION FACILITY DESIGNS AND METHODS OF MAKING AND USING THE SAME

CROSS REFERENCE TO RELATED APPLICATIONS

This application claim priority to U.S. Provisional Appln. No. 60/944,082 filed Jun. 14, 2007 entitled "Electronic Equipment Data Center or Co-Location Facility Designs and Methods of Making and Using the Same," which application is expressly incorporated by reference herein.

FIELD OF THE INVENTION

The present invention relates to electronic equipment data center or co-location facility designs and methods of making and using the same in an environmentally aware manner.

BACKGROUND

Data centers and server co-location facilities are well-known. In such facilities, rows of electronics equipment, such as servers, typically owned by different entities, are stored. In many facilities, cabinets are used in which different electronics equipment is stored, so that only the owners of that equipment, and potentially the facility operator, have access therein. In many instances, the owner of the facilities manages the installation and removal of servers within the facility, and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

There are some well-known common aspects to the designs of these facilities. For example, it is known to have the electronic equipment placed into rows, and further to have parallel rows of equipment configured back-to back so that each row of equipment generally forces the heat from the electronic equipment toward a similar area, known as a hot aisle, as that aisle generally contains warmer air that results from the forced heat from the electronics equipment. In the front of the equipment is thus established a cold aisle.

There are different systems for attempting to collect hot air that results from the electronics equipment, cooling that hot air, and then introducing cool air to the electronics equipment. These air-conditioning systems also must co-exist with power and communications wiring for the electronics equipment. Systems in which the electronics equipment is raised above the floor are well-known, as installing the communications wiring from below the equipment has been perceived to offer certain advantages. Routing wiring without raised floors is also known—though not with systematic separation of power and data as described herein.

SUMMARY OF THE INVENTION

The present invention relates to electronic equipment data center or co-location facility designs and methods of making and using the same in an environmentally aware manner.

The present invention generally provides apparatus and methods for using novel support bracket structures, and thermal panels associated with the same, that allow for distinct partitioning of air flowing in hot aisles and cold aisles, as well as for holding wiring above cabinets that are used to store electronic equipment in the facility.

In one aspect, the present invention provides a facility for maintaining electronic equipment disposed in a plurality of cage cabinets at a cool temperature using a plurality of air conditioning units, the cage cabinets positioned in at least one row so that the electronic equipment disposed therein emit heated air in a predetermined direction from the cage cabinets to establish a hot aisle, and an opposite side of the row establishing a cold aisle, the plurality of air conditioning units receiving heated air and emitting cooled air. In this aspect, the facility comprises:

a floor on which the plurality of cage cabinets are disposed in the at least one row, the floor being within a space that has walls that define a room;

a plurality of support brackets disposed along the row, so that a portion of each of the support bracket is disposed above the plurality of cage cabinets;

a thermal shield supported by the at least some of the plurality of support brackets, the thermal shield providing a contiguous wall around a hot air area above the at least one row of electronic cabinets to define a warm exhaust channel that traps the heated air within the enclosure area and causes substantially all the heated air within the enclosure area to rise up within the warm exhaust channel;

a space separated from the room in which the plurality of air conditioning units are disposed;

a warm air escape channel disposed above the warm exhaust channel, the warm air escape channel feeding the heated air to the plurality of air conditioning units; and a cool air channel that connects between the air conditioning system and the cold aisle, the cool air channel delivering cool air from the plurality of air conditioning units to the cool aisle.

In another aspect, the invention provides an apparatus for separating warm air from cooler air, the warmer air being produced within an enclosure area bounded by a plurality of cage cabinets positioned so that electronic equipment disposed therein emit heated air into the enclosure area, the cage cabinets positioned in at least one row so that the electronic equipment disposed therein emit heated air from in each in a predetermined direction from the cage cabinets to establish a hot aisle, and an opposite side of the row establishing a cold aisle. In this aspect, the apparatus comprises:

a plurality of support brackets disposed along the row, so that a portion of each of the support bracket is disposed above the plurality of cage cabinets; and a thermal shield supported by the at least some of the plurality of support brackets, the thermal shield providing a contiguous wall around a hot air area above the at least one row of electronic cabinets to define a warm exhaust channel that traps the heated air within the enclosure area and causes substantially all the heated air within the enclosure area to rise up within the warm exhaust channel.

In another aspect, the plurality of support brackets according to the invention may each further include a plurality of tiered ladder rack supports having ladder racks thereover to establish a plurality of different tiers outside the contiguous wall, so that each of the different tiers is adapted to hold a different type of transmission line that is substantially shielded from the heated air.

In a further aspect, the present invention includes a method of forming a facility for housing electrical equipment. This aspect of the invention comprises the steps of:

determining a location for at least a one row of cage cabinets that will house the electrical equipment, the at least one row of cage cabinets defining an enclosure area so that electronic equipment disposed within the cabinets will emit heated air in a predetermined direction from the electronic cabinets toward the enclosure area;

mounting a plurality of support brackets in relation to the row of cage cabinets so that at least a portion of each of the support brackets is disposed above the cage cabinets; and mounting a contiguous wall around the enclosure area above the cage cabinets using the support brackets to define the warm exhaust channel so that that substantially all warm air within the enclosure area rises up within the warm exhaust channel; and distributing wiring to at least some of the cage cabinets, the step of distributing separating each of a plurality of different types of wiring on each of a plurality of different ladder racks, each of the plurality of different ladder racks being mounted on a ladder rack support that connects to at least some of the plurality of support brackets.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

The present invention provides data center or co-location facility designs and methods of making and using the same. The data center or co-location facility designs have certain features that will be apparent herein and which allow many advantages in terms of efficient use of space, efficient modular structures that allow for efficiency in the set-up of co-location facility and the set-up of the electronics equipment in the facility, as well as efficient air-conditioning within the facility. Each of these features has aspects that are distinct on their own, and combinations of these features also exist that are also unique.

Figure 1A:
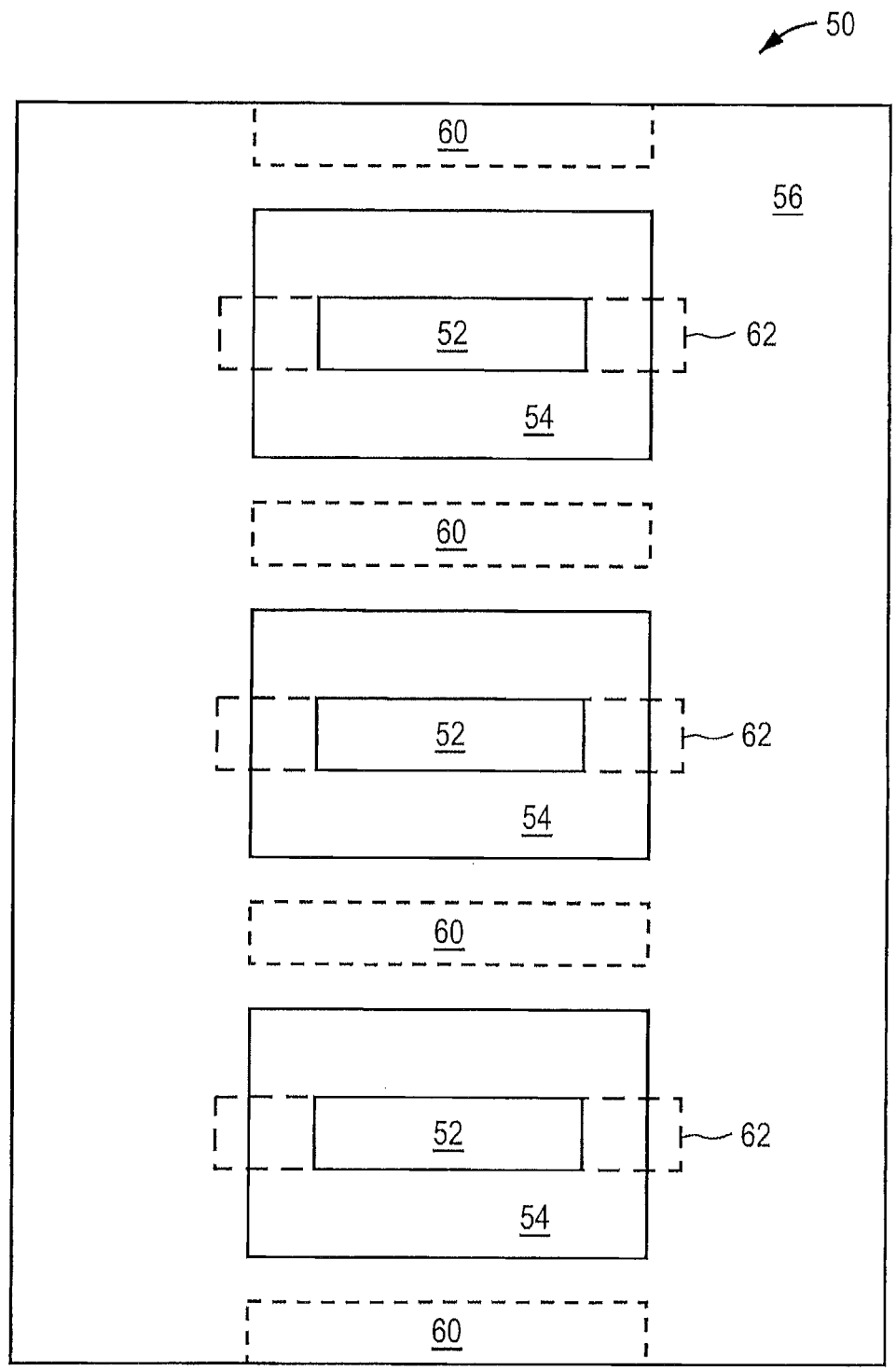
FIG. 1(a) illustrates a floor design used in a data center or co-location facility according to the present invention.

FIG. 1(a) illustrates a floor design used in a data center or co-location facility according to the present invention. The preferred embodiment discussed herein uses parallel rows of equipment configured back-to back so that each row of equipment generally forces the heat from the electronic equipment towards a hot aisle, thus also establishing a cold aisle in the front of the equipment. The cold aisles in FIG. 1(a) are illustrated at the dotted line block 60, wherein the hot aisles are illustrated at the dotted line block 62. One feature of the present invention is the provision for marking the floor 50 to explicitly show the various areas of the facility. As illustrated, the hot aisle 62 has a central area 52 that is tiled, painted, taped or otherwise marked to indicate that it is center area of the hot aisle 62. The typical dimensions of the central area 52 are typically in the range of 2'-4' across the width, with a row length corresponding to the number of electronic cabinets in the row. Marking with tiles is preferable as the marking will last, and tiles that are red in color, corresponding to the generation of heat, have been found preferable. Around this center area 52 is a perimeter area 54, over which the cabinets are installed. This perimeter area 54 is marked in another manner, such as using a grey tile that is different in color from the center area 52. Around the perimeter area 54 is an outside area 56, which is marked in yet a different manner, such as using a light grey tile. The placement of these markings for areas 52, 54 and 56 on the floor of the facility, preferably prior to moving any equipment onto the floor, allows for a visual correspondence on the floor of the various hot and cold aisles. In particular, when installing cabinets over the perimeter 54 are, the area that is for the front of the cabinet that will face the cold aisle, and thus the area for the back of the cabinet for the hot aisle, is readily apparent.

Figure 1B:
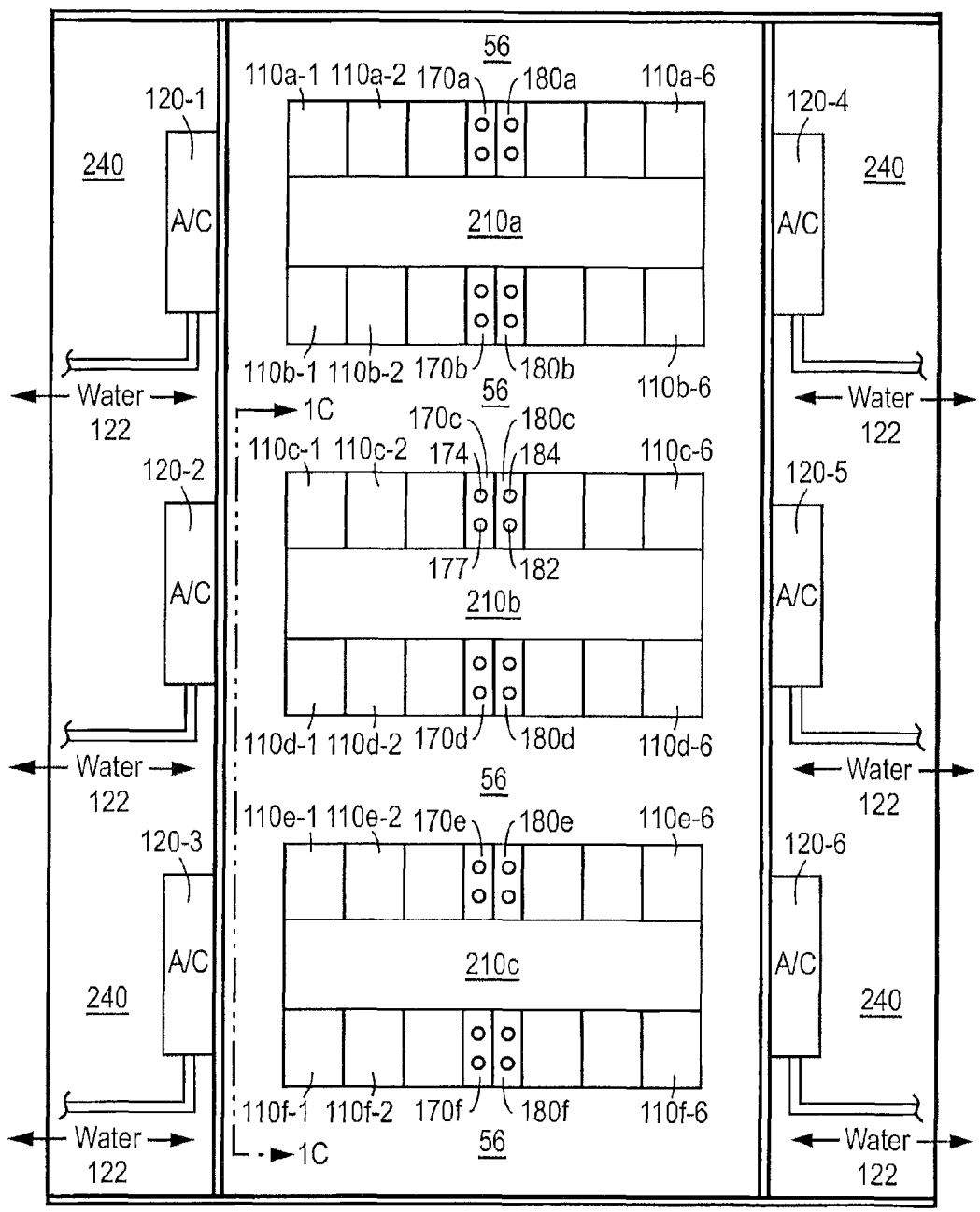
FIG. 1(b) illustrates floor-based components disposed over the floor design according to the present invention.

FIG. 1(b) illustrates floor-based components disposed over the floor design of the co-location facility according to the present invention. FIG. 1(b) also shows additional area of the floor, which in this embodiment is provided to illustrate interaction of the electronics equipment with the evaporators of the air conditioning units. In the embodiment described with respect to FIG. 1(b), certain features are included so that conventional equipment, particularly conventional air conditioning equipment, can effectively be used while still creating the desired air flow patterns of the present invention as described herein.

Before describing the components in FIG. 1(b), an aspect of the present invention is to isolate the hot air exhaust from the areas that require cooling as much as possible, and to also create air flows in which the air moves through the exhaust system, into the air conditioning system, through the air conditioning ducts and out to the cool equipment in a very rapid manner. In particular, the amount of circulation established according to the present invention moves air at a volume such that the entire volume of air in the facility recirculates at least once every 10 minutes, preferably once every 5 minutes, and for maximum cooling once every minute. It has been found that this amount of recirculation, in combination with the air flows established by the present invention, considerably reduce the temperature in the facility in an environmentally efficient manner, thus saving energy, as described herein.

Cabinets 110 shown in FIG. 1(b) are placed generally over the sides of the perimeter 54 as described, in rows, which cabinets are formed as cages in order to allow air to flow through them. Different rows are thus shown with cabinets 110(a-f), with each letter indicating a different row. Also included within the rows are telecommunications equipment 170 to which the electronics equipment in each of the cabinets 110 connect as described further herein, as well as power equipment 180 that is used to supply power along wires to the electronics equipment in each of the cabinets 110 connect as described further herein. Air conditioning units include the evaporator units 120 (1-6) that are shown being physically separated by some type of barrier from the area 56 described previously with respect to FIG. 1(a). The condenser units of the air conditioning system that receive the warmed refrigerant/water along lines 122 and are disposed outside the walls of the facility are not shown. This physical separation is implemented in order to establish warm exhaust channel area 240 from the physical space, which warm air area connects to a separate warm air area in the ceiling and allow the warm air to flow into the exhaust channel area 240 and enter into intake ducts of evaporator air conditioning equipment 120, as will be described. This feature allows the usage of conventional evaporator air conditioning equipment that has air intakes at the bottom of the unit, as well as allows for usage of different air conditioning equipment types, while still maintaining an efficient airflow throughout the entire facility.

Figure 1C:
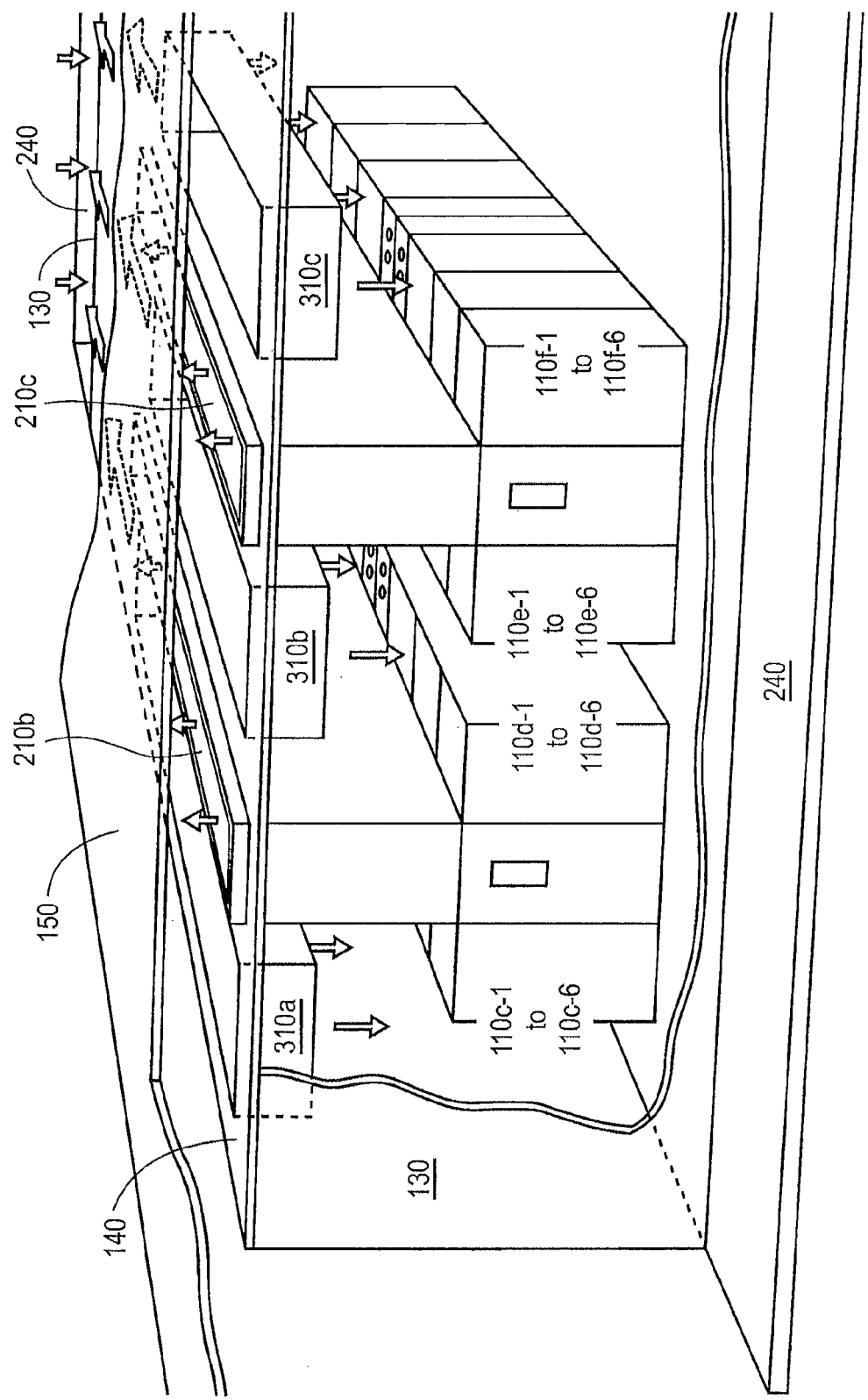
FIG. 1(c) illustrates a perspective cut-away view along line c-c from FIG. 1(a) of FIG. 1(a) according to the present invention.

FIG. 1(c) illustrates a perspective cut-away view along line c-c from FIG. 1(a) of the FIG. 1(a) co-location facility according to the present invention. Additionally illustrated are the false ceiling 140 and the actual ceiling 150, which have a gap that is preferably at least 1.5-3 feet and advantageously at least 15 feet, as the higher the ceiling the more the warm air rises (and thus also stays further away from the equipment in the cabinets 110). The false ceiling 140 is preferably made of tiles that can be inserted into a suspended ceiling as is known, which tiles preferably have are drywall vinyl tiles, which exhibit a greater mass than many conventional tiles. Also shown are arrows that illustrate the air flow being centrally lifted upward from the warm exhaust channel area 240 to the area between the false ceiling 140 and the actual ceiling 150, and the flow within the ceiling toward the warm exhaust channel area 240, and then downward into the warm exhaust channel area 240 with the wall 130 separating the area 56 and the warm exhaust channel area 240. Also shown are arrows that take cold air from the cold air ducts 310 and insert the air into the cold aisles 60.

Though the arrows in the drawing are directed straight downward, the vents themselves can be adjusted to allow for directional downward flow at various angles. In a preferred embodiment, each of the vents have a remote controlled actuator that allows for the offsite control of the vents, both in terms of direction and volume of air let out of each vent. This allows precise control such that if a particular area is running hot, more cold air can be directed thereto, and this can be detected (using detectors not shown), and then adjusted for offsite.

Figure 2A:
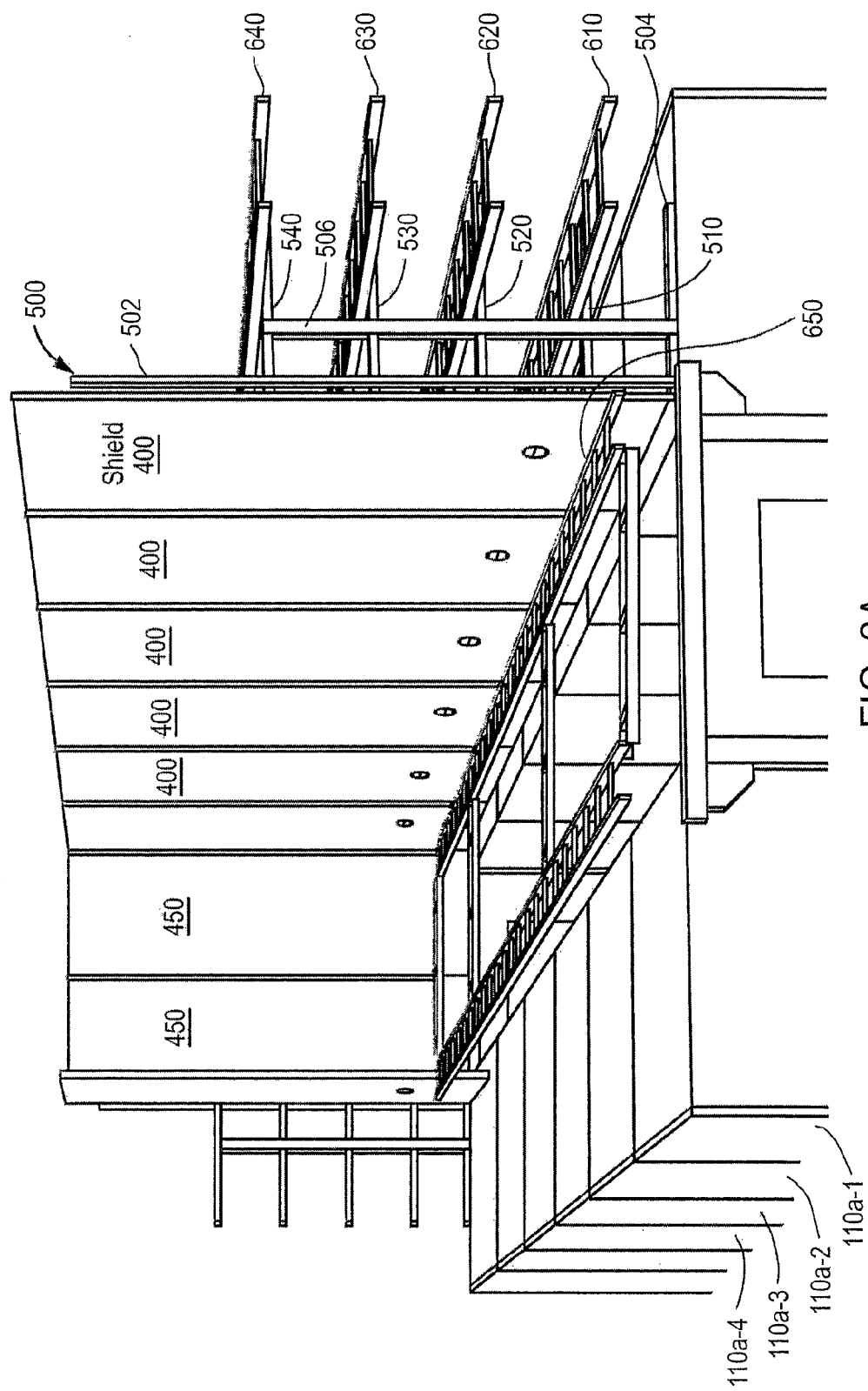
FIGS. 2(a)-(c) illustrate various cut-away perspective views of the thermal compartmentalization and cable and conduit routing system according to the present invention.
Figure 2B:
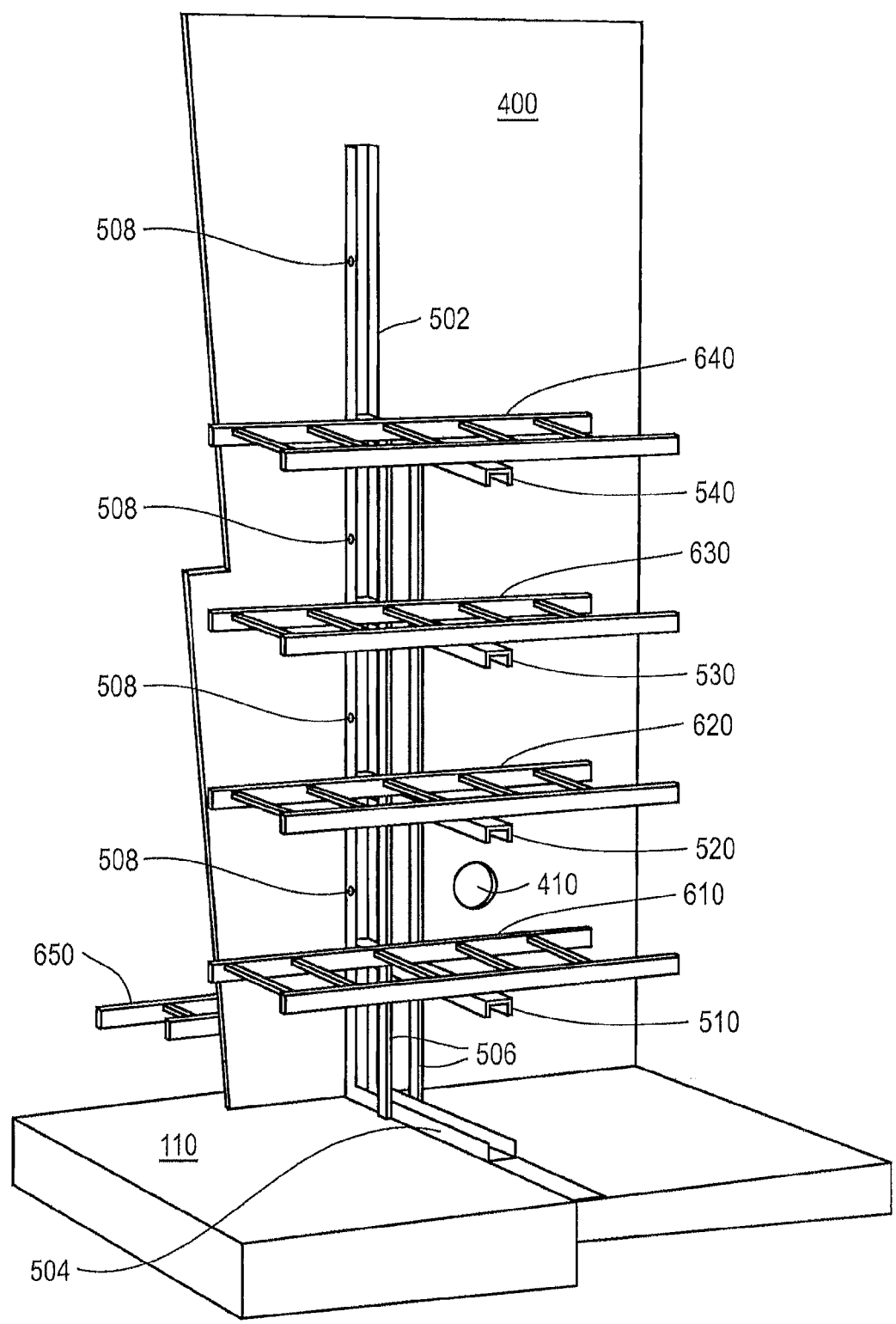
Figure 2C:
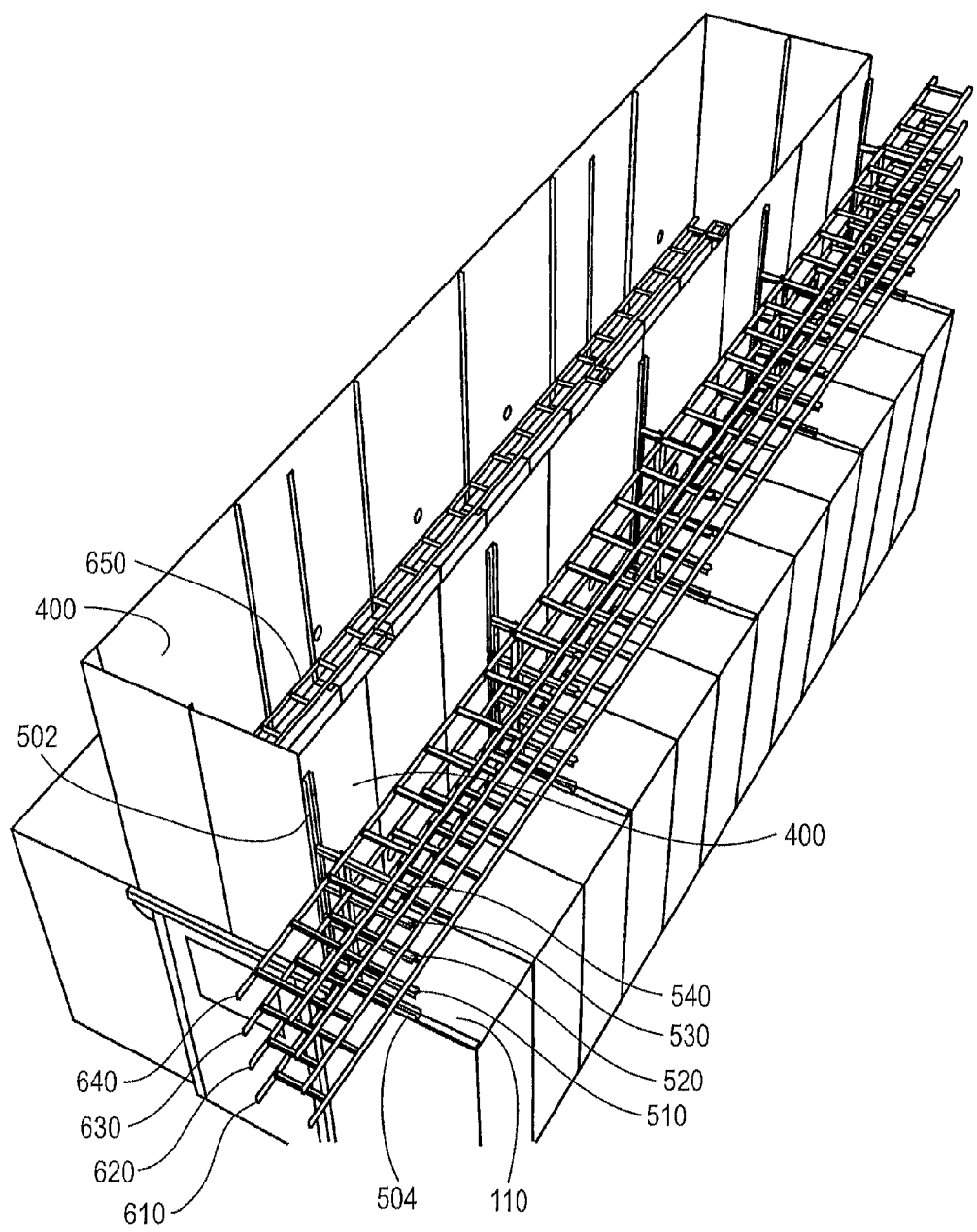

FIGS. 2(a)-(c) illustrate various cut-away perspective views of the thermal compartmentalization and cable and conduit routing system according to the present invention. In particular, FIG. 2(a) illustrates a cut away view of a portion of the warm exhaust channel area 240, which rests on top of the cabinets 110, and is formed of a plurality of the thermal shields 400 and 450, which are modular in construction and will be described further hereinafter. Also illustrated are shield brackets 500 that are mounted on top of the cabinets 110, and provide for the mounting of the shields 400 and 450, as well as an area on top of the cabinets 110 to run power and telecommunications cables, as will be described further herein.

Figure 4:
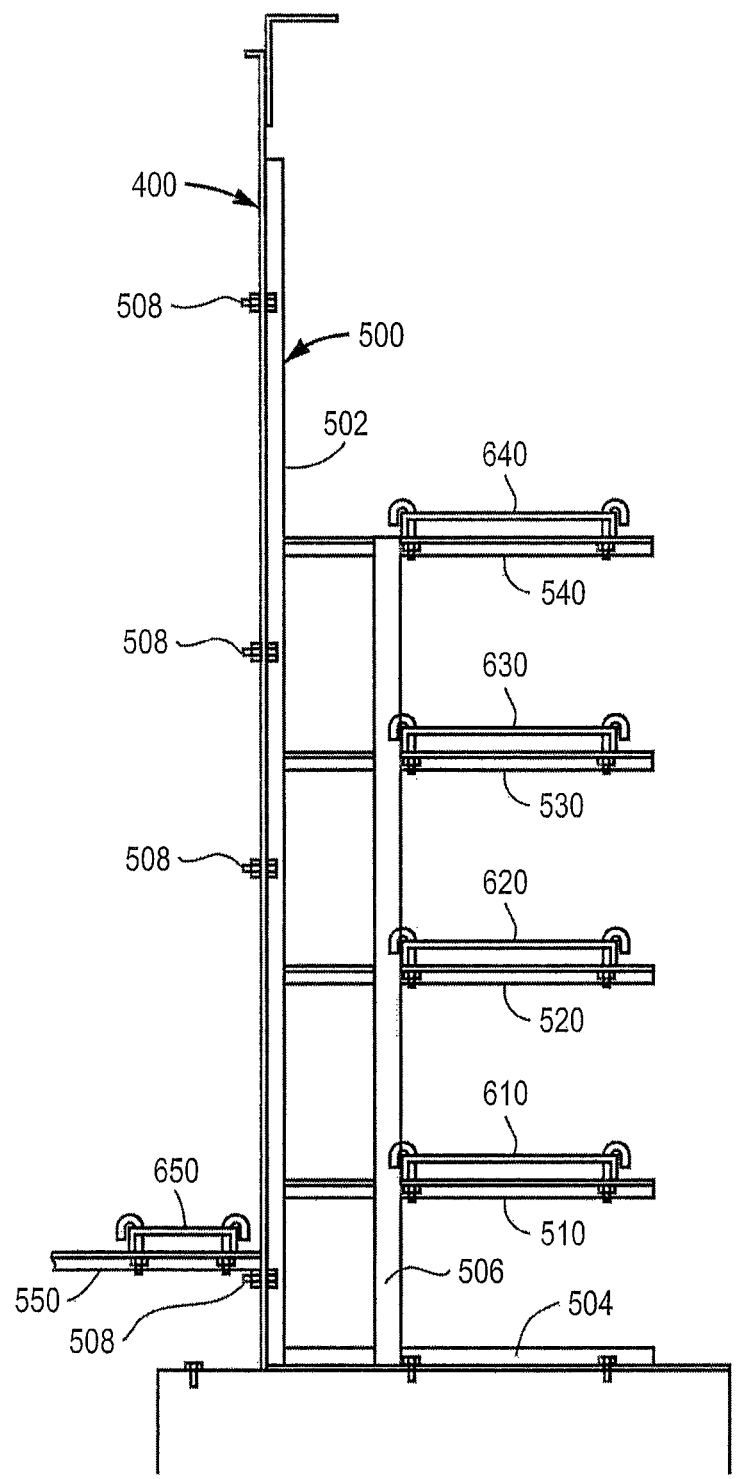
FIG. 4 illustrates illustrate a telecommunication bracket used in the thermal compartmentalization and cable and conduit routing system according to the present invention.

Before describing the cabling, FIG. 2(b) and FIG. 4 illustrate the shield bracket 500, which is made of structurally sound materials, such as steel with a welded construction of the various parts as described, molded plastic, or other materials. Ladder rack supports 510, 520, 530, 540 and 550 are attached to back vertical support 502 of the shield and cabling support bracket 500 and used to allow ladder racks 610, 620, 630, 640, and 650 respectively, placed thereover as shown. The ladder racks are intended to allow for a segregation of data and electrical power, and therefore an easier time not only during assembly, but subsequent repair. The ladder racks are attached to the ladder rack supports using support straps shown in FIG. 4, which are typically a standard "j" hook or a variant thereof. As also illustrated in FIG. 4, a support beams structure 506 provides extra support to the ladder rack, and the holes 508 are used to secure the shields 400 and 450 thereto. Horizontal support plate 504 is used to support the bracket 500 on the cabinets 110.

With respect to the cabling and conduit, these are used to provide electrical power and data to the various servers in the facility. Conduit, also typically referred to as wiring, is used to provide electricity. Cabling is used to provide data. In this system, it is preferable to keep the electrical power and the data signals separated.

Within the system, ladder rack 610 is used for data cabling on the cold aisle side of the thermal shields 400. Ladder rack 620 is used for an A-source power conduit (for distribution of 110-480 volt power) on the cold aisle side of the thermal shields 400. Ladder rack 630 is used for B-source power conduit (for distribution of 110-480 volt power), which is preferably entirely independent of A-source power conduit, on the cold aisle side of the thermal shields 400. Ladder rack 640 is used for miscellaneous cabling on the cold aisle side of the thermal shields 400. Ladder rack 650 is used for data cabling on the hot aisle side of the thermal shields 400. Each ladder rack can also be used for different purposes and still be within the scope of the present invention.

Figure 3A:
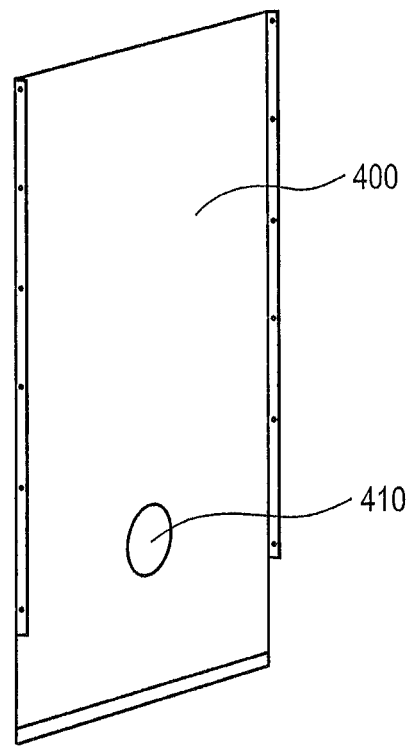
FIGS. 3(a) and (b) illustrate modular thermal shields used in the thermal compartmentalization and cable and conduit routing system according to the present invention.
Figure 3B:
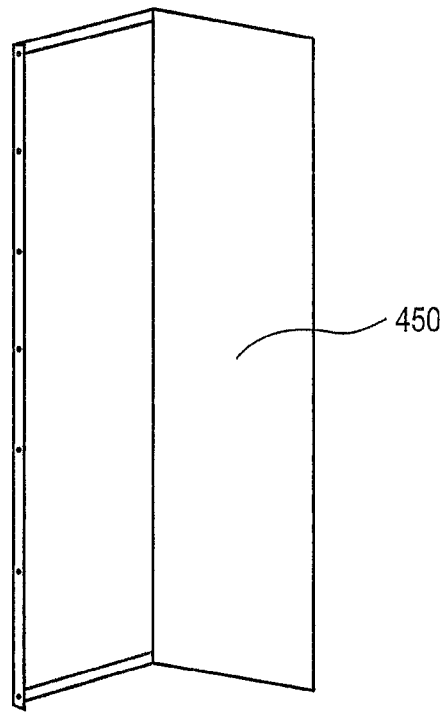

FIGS. 3(a) and (b) illustrate modular thermal shields 400 and 450, respectively, used in the thermal compartmentalization and cabling and conduit routing system according to the present invention. Both shields 400 and 450 are made of a structurally sound material, including but not limited to steel, a composite, or a plastic, and if a plastic, one that preferably has an air space between a front piece of plastic and a back piece of plastic for an individual shield 400. Shield 400 includes a through-hole 410 that allows for certain cabling, if needed, to run between the hot and cold aisle areas, through the shield 400. A through-hole cover (not shown) is preferably used to substantially close the hole to prevent airflow therethrough. Shield 450 has a 90 degree angle that allows the fabrication of corners.

It should be appreciated that the construction of the cabinets, the shields 400 and 450, and the shield supports 500 are all uniform and modular, which allows for the efficient set-up of the facility, as well as efficient repairs if needed.

Other different embodiments of data center or co-location facilities according to the present invention also exist. For example, while the false ceiling 140 is preferred, many advantageous aspects of the present invention can be achieved without it, though its presence substantially improves airflow. Furthermore, the evaporation units for the air conditioning system can also be located outside the facility, in which case the chamber 240 is not needed, but hot air from the ceiling can be delivered to evaporation units that are disposed above the ceiling, which is more efficient in that it allows the warm air to rise. If the complete air conditioning equipment is located outside, including the evaporators, the refrigerant/water lines 122 that are used to exchange the refrigerant/water if the evaporators are disposed inside the facility is not needed, which provides another degree of safety to the equipment therein.

It is noted that aspects of the present invention described herein can be implemented when renovating an existing facility, and as such not all of the features of the present invention are necessarily used.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

What is claimed is:

1. A facility for maintaining electronic equipment disposed in at least one cluster of cage cabinets at a cool temperature using a plurality of air conditioning units, the at least one cluster of cage cabinets positioned in a back-to-back configuration in two separated rows so that the electronic equipment disposed therein emit heated air in a predetermined direction from the cage cabinets to establish a hot aisle enclosure area between the two separated rows of cage cabinets, and an opposite side of the cage cabinets each establishing a cold aisle, the plurality of air conditioning units receiving heated air and emitting cooled air, the facility comprising:
a floor on which the plurality of cage cabinets are disposed, wherein the at least one cluster of cage cabinets is disposed in the two separated rows to establish the hot aisle enclosure area, the floor being within a space that has walls that define a room;
a plurality of support brackets disposed along each of the two rows of the at least one cluster of cage cabinets, so that a portion of each of the support bracket is disposed above the at least one cluster of cage cabinets;
a thermal shield supported by the portion of at least some of the plurality of support brackets, the thermal shield providing a contiguous wall around a hot air area above the hot aisle enclosure area at a height above the two separated rows of cage cabinets to define a warm exhaust channel that traps the heated air within the hot aisle enclosure area and causes substantially all the heated air within the hot aisle enclosure area to rise up within the warm exhaust channel, wherein the contiguous wall fully surrounds the hot aisle enclosure area from above the at least one cluster of cage cabinets;
a warm air escape channel disposed above the warm exhaust channel, the warm air escape channel feeding the heated air to the plurality of air conditioning units, wherein the warm air escape channel is bounded at a bottom by a ceiling that provides a barrier to prevent the heated air from passing therebelow, wherein an opening exists in the ceiling corresponding to the warm exhaust channel through which the heated air passes, and wherein a top edge of the thermal shield extends from the ceiling to the cage cabinets to further prevent the heated air from escaping; and
a cool air channel that connects between the air conditioning system and the cold aisle, the cool air channel delivering cool air from the plurality of air conditioning units to the cool aisle.

2. The facility according to claim 1 wherein the warm air escape channel is further bounded at a top by an upper ceiling, and wherein a distance between the upper ceiling and the ceiling is 15 feet.

3. The facility according to claim 1 further including marking on the floor, the marking including a central area marking that corresponds to the hot aisle enclosure area and a perimeter area marking that corresponds to a position over which the at least one cluster of cage cabinets are installed.

4. The facility according to claim 3 wherein the marking further includes an outer area marking that surrounds the perimeter area marking.

5. The facility according to claim 4 wherein the central area marking is one color; the perimeter area marking is another color different from the one color, and the outer area marking is a further color that is different from the one color and the another color.

6. The facility according to claim 1 wherein the plurality of support brackets each further include a plurality of tiered ladder rack supports having ladder racks thereover disposed above each of the two separated rows of cage cabinets to establish a plurality of different tiers outside the contiguous wall, so that each of the different tiers is adapted to hold a different type of transmission line that is substantially shielded from the heated air, and wherein the plurality of support brackets are connected to and supported by the at least one cluster of cage cabinets.

7. The facility according to claim 1, wherein the thermal shield is formed from a plurality of thermal shield plates that are each supported by a thermal shield support beam disposed on at least some of the plurality of support brackets, and wherein the at least some of the plurality of support brackets are connected to and supported by the at least one cluster of cage cabinets.

8. The facility according to claim 7 wherein at least some of the thermal shields have a hole disposed therein that allows for the passage of wires therethrough while being sufficiently small to only allow a small amount of airflow to pass therethrough.

9. The facility according to claim 1, wherein the thermal shield is formed from a plurality of thermal shield plates that are each supported by a thermal shield support beam disposed on at least some of the plurality of support brackets.

10. The facility according to claim 1, wherein the at least one cluster is a plurality of clusters, each of the plurality of clusters being configured as the at least one cluster, and wherein the hot aisle enclosure area and the cold aisle of at least some of the plurality of clusters are aligned.

11. The facility according to claim 10 further including marking on the floor, the marking including a central area marking that corresponds to the hot aisle enclosure area for each of the plurality of clusters of cage cabinets and a perimeter area marking that corresponds to a position over which the cage cabinets for each of the plurality of clusters are installed.

12. The facility according to claim 11 wherein the marking further includes an outer area marking that surrounds the perimeter area marking.

13. The facility according to claim 12 wherein the central area marking is one color; the perimeter area marking is another color different from the one color, and the outer area marking is a further color that is different from the one color and the another color.

14. The facility according to claim 10 wherein the plurality of support brackets each further include a plurality of tiered ladder rack supports having ladder racks thereover disposed above each of the two separated rows of cage cabinets for each of the plurality of clusters to establish a plurality of different tiers outside the contiguous wall, so that each of the different tiers is adapted to hold a different type of transmission line that is substantially shielded from the heated air, and wherein the plurality of support brackets are connected to and supported by the cage cabinets of the associated cluster.

15. The facility according to claim 14, wherein the thermal shield is formed from a plurality of thermal shield plates that are each supported by a thermal shield support beam disposed on at least some of the plurality of support brackets, and wherein the at least some of the plurality of support brackets are connected to and supported by the cage cabinets of the associated cluster.

16. The facility according to claim 15 wherein at least some of the thermal shields have a hole disposed therein that allows for the passage of wires therethrough while being sufficiently small to only allow a small amount of airflow to pass therethrough.

17. The facility according to claim 14, wherein adjacent cabinet clusters having adjacent ladder racks are aligned, and wherein at least one of the aligned ladder racks carry a common transmission line.

18. The facility of claim 10 wherein a plurality of clusters are configured in an array of at least four clusters, with the at least four clusters sharing a common cold aisle, two clusters on one side of the common cold aisle and another two clusters on another side of the common cold aisle, and wherein the hot air enclosure area of each of the two clusters are aligned and parallel to the common cold aisle, and wherein the hot air enclosure area of each of the another two clusters are aligned and parallel to the common cold aisle.

19. The facility according to claim 10 wherein the warm air escape channel is further bounded at a top by an upper ceiling, and wherein a distance between the upper ceiling and the ceiling is 15 feet.

20. The facility according to claim 10, wherein the thermal shield for each of the plurality of clusters is fanned from a plurality of thermal shield plates that are each supported by a thermal shield support beam disposed on at least some of the plurality of support brackets.

21. The facility according to claim 10, further including a thermal barrier at an end of each of the two separated rows cabinet cages in each of the plurality of clusters, thereby maintaining a contiguous sealed barrier, other than where the two separated rows of cabinet cages are disposed, around the hot aisle enclosure area of each associated cluster, thereby further ensuring that substantially all the heated air within the hot aisle enclosure area rises up within the warm exhaust channel.

22. The facility according to claim 21, wherein each of the at least one thermal barriers includes a door that permits access into the hot aisle enclosure area of the associated cluster.

23. The facility according to claim 1, further including a thermal barrier at an end of each of the two separated rows cabinet cages of the at least one cluster, thereby maintaining a contiguous sealed barrier, other than where the two separated rows of cabinet cages are disposed, around the hot aisle enclosure area, thereby further ensuring that substantially all the heated air within the hot aisle enclosure area rises up within the warm exhaust channel.

24. The facility according to claim 23, wherein at least one thermal barrier includes a door that permits access into the hot aisle enclosure area.

25. A facility for maintaining electronic equipment disposed in at least one cluster of cage cabinets at a cool temperature using a plurality of air conditioning units, the at least one cluster of cage cabinets positioned in a back-to-back configuration in two separated rows so that the electronic equipment disposed therein emit heated air in a predetermined direction from the cage cabinets to establish a hot aisle enclosure area between the two separated rows of cage cabinets, and an opposite side of the cage cabinets thereby establishing a cold aisle, the plurality of air conditioning units receiving heated air and emitting cooled air, the facility comprising:
 a floor on which the plurality of cage cabinets are disposed, wherein the at least one cluster of cage cabinets is disposed in the two separated rows to establish the hot aisle enclosure area, the hot aisle enclosure area is free from obstruction thereby allowing air flow between cage cabinets in the two separated rows of cage cabinets, the floor being within a space that has walls that define a room;
 a plurality of support brackets disposed along the two rows of the at least one cluster of cage cabinets, so that a portion of the support bracket is disposed above the at least one cluster of cage cabinets;
 a thermal shield supported by the portion of at least some of the plurality of support brackets, the thermal shield providing a contiguous wall around a hot air area above the hot aisle enclosure area at a height above the two separated rows of cage cabinets to define a warm air exhaust channel that traps the heated air within the hot aisle enclosure area and causes substantially all the heated air within the hot aisle enclosure area to rise up within the warm air exhaust channel, wherein the contiguous wall fully surrounds the hot aisle enclosure area from above the at least one cluster of cage cabinets and the contiguous wall contacts the top of the cabinet cages to enclose the warm exhaust channel;
 a thermal barrier ceiling separating the cold aisle from a thermal barrier ceiling separating the cold aisle from a warm air escape channel, the thermal barrier ceiling disposed above the warm air exhaust channel such that the thermal barrier ceiling forms the bottom of the warm air escape channel and the top of the cold aisle, the thermal barrier ceiling having an opening to the warm air exhaust channel through which heated air, from the warm air exhaust channel, flows into the warm air escape channel to thereby feed the heated air to the plurality of air conditioning units, wherein the warm air escape channel is bounded at a bottom by the thermal barrier ceiling thereby forming a barrier which prevents the heated air from passing therebelow into the cold aisle, wherein a top edge of the thermal shield extends from the ceiling the thermal barrier ceiling to the cage cabinets to further prevent the heated air from escaping from the warm air exhaust channel; and
 a cool air channel that connects between the air conditioning system and the cold aisle, the cool air channel delivering cool air from the plurality of air conditioning units to the cool aisle.

\* \* \* \* \*